United States Patent
Zhao et al.

(10) Patent No.: US 8,788,919 B2
(45) Date of Patent: Jul. 22, 2014

(54) CONVOLUTIONAL TURBO CODING METHOD AND DEVICE FOR IMPLEMENTING THE CODING METHOD

(75) Inventors: Zheng Zhao, Beijing (CN); Seung-Hoon Choi, Suwon-si (KR); Sung-Eun Park, Suwon-si (KP); Chi-Woo Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 455 days.

(21) Appl. No.: 12/647,866

(22) Filed: Dec. 28, 2009

(65) Prior Publication Data

US 2010/0169748 A1 Jul. 1, 2010

(30) Foreign Application Priority Data

Dec. 26, 2008 (CN) .......................... 2008 1 0189684

(51) Int. Cl.
*H03M 13/03* (2006.01)
(52) U.S. Cl.
USPC .......................................................... 714/790
(58) Field of Classification Search
None
See application file for complete search history.

(56) References Cited

U.S. PATENT DOCUMENTS

| 7,346,827 | B2 * | 3/2008 | Eroz et al. ...................... 714/755 |
| 7,778,197 | B2 * | 8/2010 | Kim .............................. 370/252 |
| 8,225,165 | B2 * | 7/2012 | Zheng ........................... 714/752 |
| 2006/0023680 | A1 | 2/2006 | Oh et al. |
| 2007/0220377 | A1 | 9/2007 | Park et al. |
| 2008/0209298 | A1 | 8/2008 | Chae et al. |
| 2009/0113274 | A1 | 4/2009 | Lee |
| 2010/0271929 | A1 * | 10/2010 | Yue et al. ....................... 370/203 |
| 2011/0093762 | A1 * | 4/2011 | Kwon et al. .................... 714/758 |
| 2011/0274199 | A1 * | 11/2011 | Choi et al. ...................... 375/295 |

FOREIGN PATENT DOCUMENTS

| EP | 1 189 380 A2 | 3/2002 |
| EP | 1538757 B1 | 12/2007 |
| JP | 2003-152680 A | 5/2003 |

(Continued)

OTHER PUBLICATIONS

Seunghoon Choi, Chiwoo Lim, Songnam Hong, Sung-Eun Park, Zheng Zhao, CTC Bit grouping for IEEE 802.16m Amendment, Jan. 7, 2009, Retrieved from the Internet: URL: http://www.ieee802.org/16/tgm/contrib/C80216m-09_0301.pdf.

(Continued)

*Primary Examiner* — Michael Maskulinski
(74) *Attorney, Agent, or Firm* — Jefferson IP Law, LLP

(57) ABSTRACT

A method and apparatus for Convolutional Turbo Coding (CTC), and an apparatus for a turbo encoder are provided. The method for CTC includes the steps of encoding information bits A and B using a constituent encoder, and outputting parity sequences $Y_1$ and $W_1$, interleaving the information bits A and B using a CTC interleaver to obtain information bits C and D, and encoding the interleaved information bits C and D using the constituent encoder to obtain parity sequences $Y_2$ and $W_2$, interleaving the information bits A and B, the parity sequences $Y_1$ and $W_1$ and the parity sequences $Y_2$ and $W_2$, respectively, wherein the bits in at least one of a bit group constituted of the information bits A and B, a bit group constituted of the sequences $Y_1$ and $W_1$, and a bit group constituted of the sequences $Y_2$ and $W_2$ are alternately mapped to bits of constellation points with high reliability and low reliability and puncturing the interleaving result to obtain the encoded bit sequences.

12 Claims, 7 Drawing Sheets

(56) References Cited

FOREIGN PATENT DOCUMENTS

| JP | 2003-198503 A | 7/2003 |
|---|---|---|
| JP | 2007-519361 A | 7/2007 |
| KR | 10-2002-0096197 A | 12/2002 |
| KR | 10-2003-0032381 A | 4/2003 |
| RE | 2007104584 A | 8/2008 |
| RU | 2274950 C2 | 4/2006 |
| WO | 2006/068371 A1 | 6/2006 |
| WO | 2008/020712 A1 | 2/2008 |
| WO | 2009/059551 A1 | 5/2009 |

OTHER PUBLICATIONS

Cho et al., On the General BER Expression of Once- and Two-Dimensional Amplitude Modulations, IEEE Transactions on Communications, Jul. 1, 2002, vol. 50, No. 7, IEEE Service Center, Piscataway, NJ, US.

IEEE Standard for Local and Metropolitan Area Networks Part 16: Air Interface for Fixed Broadband Wireless Access Systems, Jan. 1, 2004, pp. 594-617, IEEE Service Center, Piscataway, NJ, US.

Modifying CTC Symbol Selection Method to Enhance CTC IR H-ARQ Performance, IEEE C802. 16m-07/294R1, Nov. 15, 2007.

Rongdao Yu et al., "A Rate Matching Scheme for CTC", IEEE 802.16 Broadband Wireless Access WG, IEEE C802.16m-08/750, Jul. 7, 2008 Attachment 2: KR Patent Publication No. 10-2005-0064442, Jun. 9, 2005.

DRAFT Standard for Local and Metropolitan Area Network, "Part 16: Air Interface for Fixed Broadband Wireless Access Systems", IEEE P802.16 (Draft Mar. 2007), 2007.

John Liebetreu et al., OFDMA PHY Enhancements using Hybrid ARQ, IEEE C802.16d-04/44r1, Mar. 15, 2004.

John Liebetreu et al., OFDMA PHY Enhancements for better mobility performance, C802.16d-04/50r3, Mar. 18.

\* cited by examiner

CONVOLUTIONAL TURBO CODING METHOD AND DEVICE FOR IMPLEMENTING THE CODING METHOD

PRIORITY

This application claims the benefit under 35 U.S.C. §119 (a) of a Chinese patent application filed on Dec. 26, 2008 in the State Intellectual Property Office of the People's Republic of China and assigned serial number 200810189684.9, the entire disclosure of which is hereby incorporated by reference.

BACKGROUND OF THE INVENTION

1. Field of the Invention

The present invention relates to a coding method in a wireless mobile communication system. More particularly, the present invention relates to a Convolutional Turbo Coding (CTC) method and a device for implementing the method.

2. Description of Related Art

Mobile Worldwide Interoperability for Microwave Access (WiMAX) is a broadband access technique for implementing "last kilometer" access by using a wireless mode, instead of using a wired mode. It integrates the mobile devices with a fixed broadband network, and provides a convenient and high-speed mobile broadband connection by employing a broadband wireless access technique and a flexible network structure. The WiMAX technique is based on the Institute of Electrical and Electronics Engineers (IEEE) 802.16 standards, which are proposed for microwave and millimeter-wave frequency bands. The mobile WiMAX standard was proposed after the IEEE 802.16d fixed WiMAX standard was proposed. The mobile WiMAX aims to support mobility of the broadband access by building on research started during the standardization of the fixed WiMAX standard. Convolutional Turbo Code (CTC) is a class of Turbo code using several convolution coding schemes. The CTC is incorporated into the IEEE 802.16 and Digital Video Broadcasting—Return Channel via Satellite (DVB-RCS) standards because of its high error correction performance.

FIG. 1 illustrates a CTC encoder according to the related art. Referring to FIG. 1, the CTC encoder may comprise a ⅓ CTC encoder 101, an interleaver 102 and a puncturing unit 103. As shown in FIG. 1, input information bits are input to the ⅓ CTC encoder 101. Here, the number of encoded output information bits and parity bits is three times the number of information bits. The encoded data is then interleaved by the interleaver 102. The puncturing unit 103 punctures the interleaved data based on the transmission rate, i.e., it chooses the data bits to be transmitted and obtains the encoded bit sequence so as to complete the encoding process.

More specifically, in the ⅓ CTC encoder 101, a duo binary Circular Recursive Systematic Convolutional (CRSC) code is employed. As shown in FIG. 1, the ⅓ CTC encoder 101 may comprise a CTC interleaver 105 and a constituent encoder 104. Here, the inputs A and B to the CTC interleaver 105 represent the input information bits, which are encoded twice. First, the duo binary CRSC coding is performed on the information bits A and B. That is, a set of information bits A, and B, are simultaneously input to the constituent encoder 104 for encoding, and parity sequences $Y_1$ and $W_1$ are obtained. The information bits A and B are also interleaved by the CTC interleaver 105. The second constituent encoding process is then performed to the interleaved sequences. That is, interleaved information bits $A_j$ and $B_j$ are simultaneously input to the constituent encoder 104 so as to obtain parity sequences $Y_2$ and $W_2$. Each code block input into the constituent encoder 104 contains k information bits or N pairs of information bits, i.e., k=2×N, where k is a multiple of 8, and N is a multiple of 4, and 32≤N≤4096.

As shown in block 106, the interleaver 102 may comprise a symbol separation module, a subblock interleaving module and a symbol grouping module. The symbol separation module is used to allocate the information bits and the encoded bits to 6 subblocks, which are in turn A, B, $Y_1$, $Y_2$, $W_1$ and $W_2$ described above. The subblock interleaving module is used to interleave these 6 subblocks respectively within each of the subblocks. The interleaving order is the same for each subblock. Assume that after the subblock interleaving is performed respectively to the blocks A, B, $Y_1$, $Y_2$, $W_1$ and $W_2$, the obtained bit sequences are denoted as A', B', $Y'_1$, $Y'_2$, $W'_1$ and $W'_2$, then $$A',B',Y'_1,Y'_2,W'_1,W'_2 = A'_0,A'_1,\ldots,A'_{N-1};$$
$$B'_0,B'_1,\ldots,B'_{N-1};Y'_{1,1},\ldots,Y'_{1,N-1};$$
$$Y'_{2,0},Y'_{2,1},\ldots,Y'_{2,N-1};W'_{1,0},W'_{1,1},\ldots,W'_{1,N-1};$$
$$W'_{2,0},W'_{2,1},\ldots,W'_{2,N-1}.$$

FIG. 2 illustrates subblock interleaving operations according to the related art. Referring to FIG. 2, a symbol separation module separates encoded bits into subblocks A, B, $Y_1$, $Y_2$, $W_1$ and $W_2$ in step 201. A subblock interleaving performs an interleaving operation to the subblocks A, B, $Y_1$, $Y_2$, $W_1$ and $W_2$ in step 202 and a symbol grouping module groups the interleaved subblocks in step 203. Herein, subblocks A and B are output by the symbol grouping module, and the two subblocks $Y_1$ and $Y_2$ and the two subblocks $W_1$ and $W_2$ are alternately output. After the symbol grouping, the output sequences are $A'_0, A'_1, \ldots, A'_{N-1}; B'_0, B'_1, \ldots, B'_{N-1}; Y'_{1,0}, Y'_{2,0}, Y'_{1,1}, Y'_{2,1}, Y'_{2,N-1}; W'_{1,0}, W'_{2,0}, W'_{1,1}, W'_{2,1}, \ldots, W'_{1,N-1}, W'_{2,N-1}$.

In the CTC of the related art, bit reliability in high order modulation is not taken into account. Here, the reliability refers to an average distance between a constellation point of which a certain mapped bit is "0" and a constellation point of which this mapped bit is "1" in a modulation constellation. The larger the distance, the greater the reliability of the mapped bit.

In a mobile communication system, in order to improve the data transmission rate without any increase of the bandwidth, an M-order Quadrature Amplitude Modulation (M-QAM) scheme may be applied. However, high order modulation is an unequal error protection modulation. For M>4, the respective bits mapped to the M-QAM symbols have different Bit Error Rates (BERs) Inner points of the constellation have less energy and thus may be subject to fading more easily. Accordingly, the bits constituting these symbols are less reliable. In contrast, the bits constituting the points outside the constellation are more reliable.

FIG. 3 illustrates reliability of bit mapping of high order modulation according to the related art. Referring to FIG. 3, the mapping order of bits is $i_1 i_2 q_1 q_2$, with $i_1=0$ and $i_1=1$ respectively corresponding to the constellation points in the right half plane and in the left half plane, and $i_2=0$ and $i_2=1$ respectively corresponding to the constellation points in the middle and at the two sides of the constellation. In this way, the average distance between the constellation points where $i_1=1$ and where $i_1=0$ is larger than that corresponding to $i_2$. Therefore, at the receiving end, $i_1$ has higher reliability than $i_2$.

FIG. 4 illustrates a constituent encoder of a ⅓ CTC encoder implementing duo binary CRSC coding according to the related art. Referring to FIG. 4, when CTC is performed, the input bit A, 401 and the input bit B, 402 are used as a set of inputs to the ⅓ CTC encoder, and the parity bits $Y_i$ and $W_i$ embody the combined information of the information bit A, and the information bit $B_i$. In this type of duo binary coding, the bit A, and the bit B, should be considered as a whole and treated like a group unit. In the design of the CTC of the related art, if the bit A is mapped to a bit with high reliability, the bit B, is also mapped to a bit with high reliability. In addition, if the bit A, is mapped to a bit with low reliability, the bit B, is also mapped to a bit with low reliability. The information bits in the sequence A and the information bits in the sequence B that are simultaneously input to the constituent encoder are said to constitute a bit group. Therefore, from the perspective of the group unit ($A_i$, $B_i$), different group units have unequal bit reliability. Some group units have high reliability whereas some have low reliability.

Accordingly, there is a problem with the technique of the related art in that combining A, and B, for bit mapping is not taken into account. In addition, there is a problem with the technique of the related art in that the bit reliability of high order modulation is not taken into account during mapping.

SUMMARY OF THE INVENTION

An aspect of the present invention is to address at least the above-mentioned problems and/or disadvantages and to provide at least the advantages described below. According to an aspect of the present invention, a Convolutional Turbo Coding (CTC) method is provided. The method includes the steps of encoding information bits A and B using a constituent encoder, and outputting parity sequences $Y_1$ and $W_1$, interleaving the information bits A and B using a CTC interleaver to obtain information bits C and D, and encoding the interleaved information bits C and D using the constituent encoder to obtain parity sequences $Y_2$ and $W_2$, interleaving the information bits A and B, the parity sequences $Y_1$ and $W_1$ and the parity sequences $Y_2$ and $W_2$, respectively, wherein the bits in at least one of a bit group constituted of the information bits A and B, a bit group constituted of the sequences $Y_1$ and $W_1$, and a bit group constituted of the sequences $Y_2$ and $W_2$ are alternately mapped to bits of constellation points with high reliability and low reliability and puncturing the interleaving result to obtain the encoded bit sequences.

According to another aspect of the present invention, an apparatus for CTC is provided. The apparatus includes a constituent encoder for encoding information bits A and B and outputting parity sequences $Y_1$ and $W_1$, a CTC interleaver for interleaving the information bits A and B to obtain new information bits C and D, and for providing the interleaved information bits C and D to the constituent encoder for encoding to obtain parity sequences $Y_2$ and $W_2$, an interleaver for interleaving the information bits A and B, the parity sequences $Y_1$ and $W_1$ and the parity sequences $Y_2$ and $W_2$, respectively, wherein the bits in at least one of a bit group constituted of the information bits A and B, a bit group constituted of the sequences $Y_1$ and $W_1$, and a bit group constituted of the sequences $Y_2$ and $W_2$ are alternately mapped to bits of constellation points with high reliability and low reliability, and a puncturing unit for puncturing the output sequences from the interleaver to obtain the encoded bit sequences.

According to yet another aspect of the present invention, an apparatus for a turbo encoder is provided. The apparatus includes an interleaved information subblock A, an interleaved information subblock B, wherein information subblocks A and B are by-passed, a bit-by-bit multiplexed parity sequence of interleaved $Y_1$ and $Y_2$ sub¬ block sequences, the bit-by-bit multiplexed sequence of interleaved $Y_1$ and $Y_2$ sub¬ block sequences consisting of a first output bit from a $Y_1$ subblock interleaver, a first output bit from a $Y_2$ subblock interleaver, a second output bit from the $Y_1$ subblock interleaver, and a second output bit from the $Y_2$ subblock interleaver, and a bit-by-bit multiplexed parity sequence of the interleaved $W_2$ and $W_1$ subblock sequences, the bit-by-bit multiplexed sequence of interleaved $W_2$ and $W_1$ sub¬ block sequences consisting of a first output bit from a $W_2$ subblock interleaver, a first output bit from a $W_1$ subblock interleaver, a second output bit from the $W_2$ subblock interleaver, and a second out¬ put bit from the $W_1$ subblock interleaver.

According to still another aspect of the present invention, A, and B, are combined for bit mapping. Furthermore, the bit reliability of high order modulation is taken into account during the mapping so that the reliability of the coding is improved.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
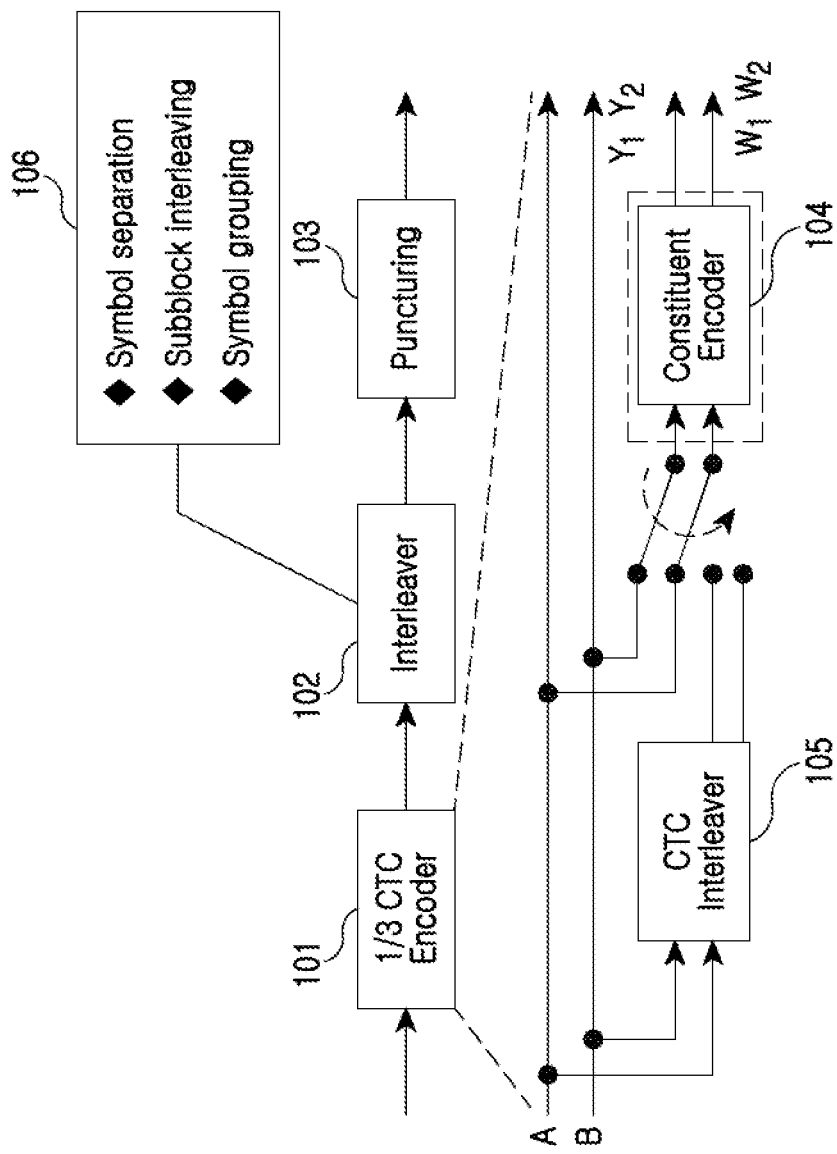
FIG. 1 illustrates a Convolutional Turbo Code (CTC) according the related art.
Figure 2:
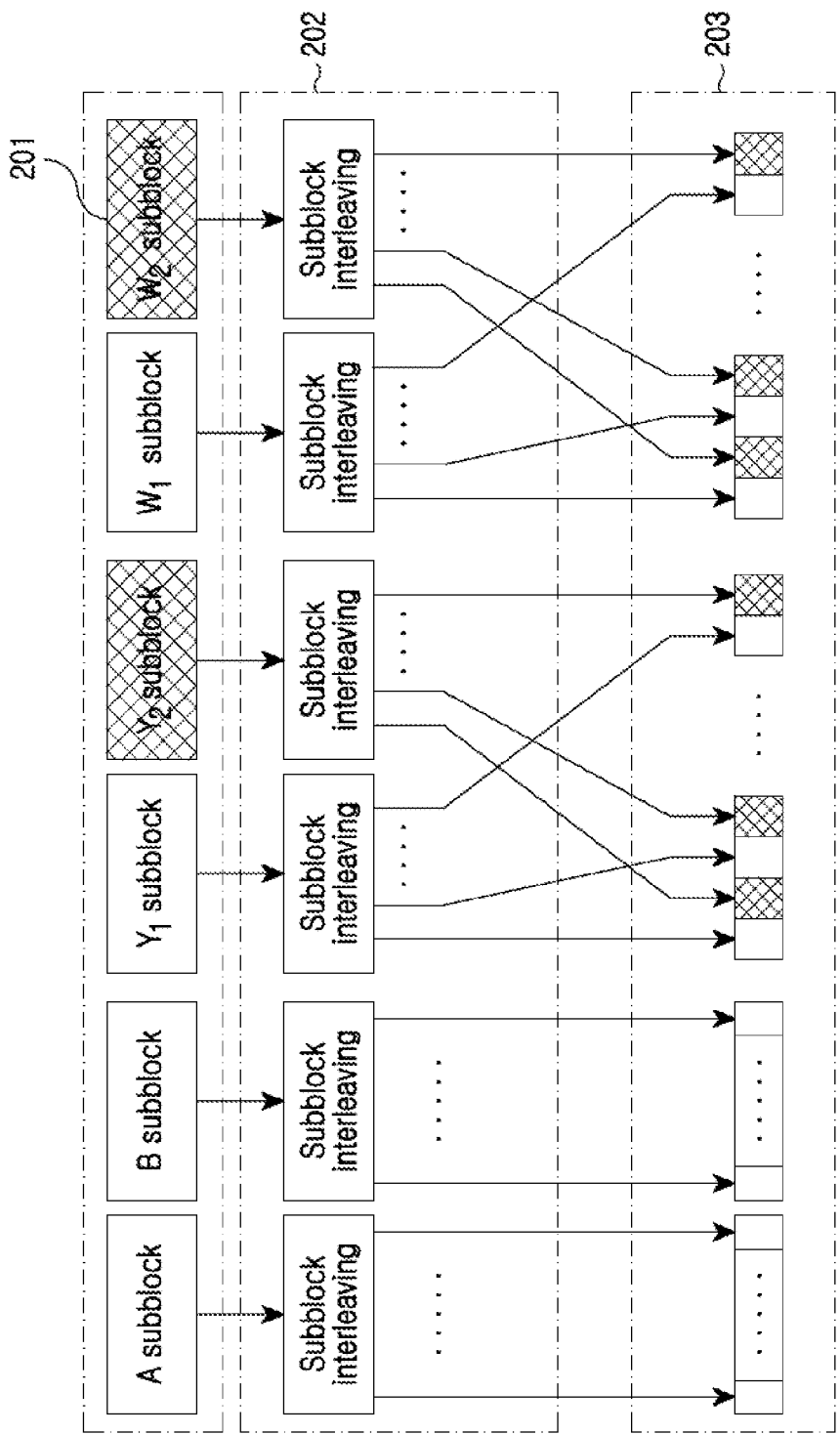
FIG. 2 illustrates subblock interleaving operations according to the related art.
Figure 3:
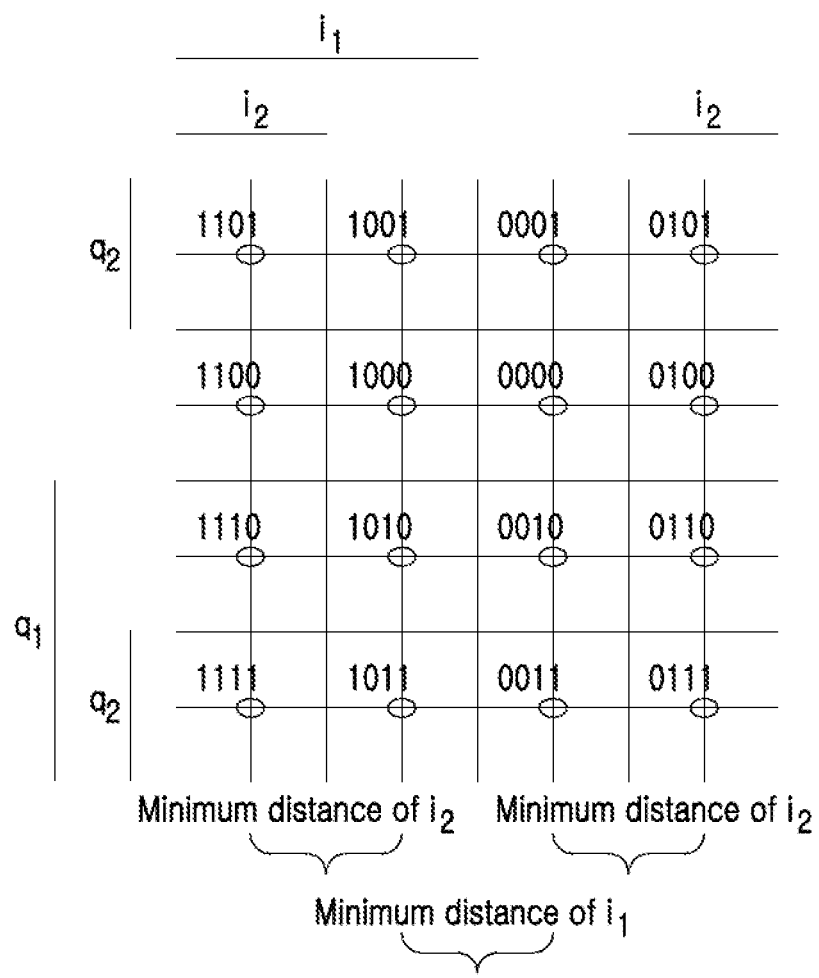
FIG. 3 illustrates reliability of bit mapping of high order modulation according to the related art.
Figure 4:
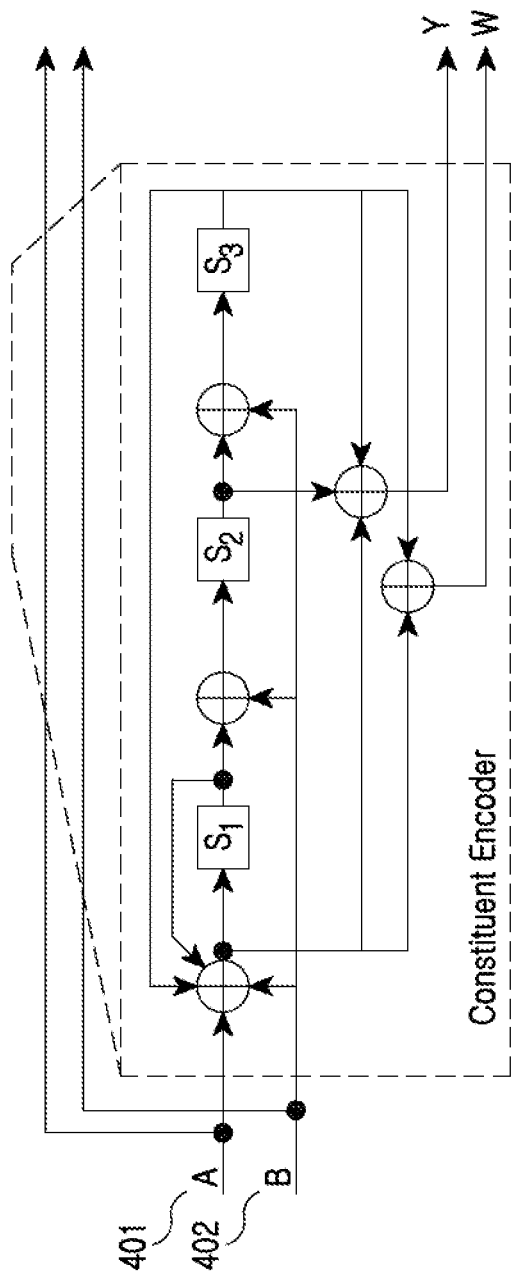
FIG. 4 illustrates a constituent encoder of a ⅓ CTC encoder implementing duo binary Circular Recursive Systematic Convolutional (CRSC) coding according to the related art.

Exemplary embodiments of the present invention provide improvements in a symbol grouping module, such as the interleaver 102 of the Convolutional Turbo Code (CTC) illustrated in FIG. 1. Hereafter, it is assumed that the outputs from the subblock interleaving module in the interleaver are sequences A', B', $Y'_1$, $Y'_2$, $W'_1$ and $W'_2$.

According to an exemplary scheme, sequence A' is mapped first. Then, the corresponding bit in sequence B' that is input to the CTC encoder simultaneously with each bit in sequence A' is found. The bit that is input to the CTC encoder simultaneously with $A'_i$ is denoted as $B'_j$. $B'_j$ is referred to as a group unit corresponding bit of $A'_i$. Then, sequence B' is mapped. If $A'_i$ is mapped to a bit with high reliability, its group unit corresponding bit $B'_j$ should be mapped to a bit with low reliability. Also, if $A'_i$ is mapped to a bit with low reliability, its group unit corresponding bit $B'_j$ should be mapped to a bit with high reliability.

Furthermore, according to a second exemplary scheme, sequence $Y'_1$ may be mapped first. Then, the corresponding bit in sequence $W'_1$ that is output from the CTC encoder simultaneously with each bit in sequence $Y'_1$ is found. The parity bit that is output from the CTC encoder simultaneously with $Y'_{1,i}$ is denoted as $W'_{1,j}$. $W'_{1,j}$ is referred to as a group unit corresponding unit of $Y'_{1,i}$. Then, sequence $W'_1$ is mapped. If $Y'_{1,i}$ is mapped to a bit with high reliability, its group unit corresponding bit $W'_{1,j}$ should be mapped to a bit with low reliability. Also, if $Y'_{1,i}$ is mapped to a bit with low reliability, its group unit corresponding bit $W'_{1,j}$ should be mapped to a bit with high reliability. The parity bits in sequence $Y'_1$ and the bits in sequence $W'_1$, which are simultaneously output from a constituent encoder, constitute a bit group.

Moreover, according to a third exemplary scheme, sequence $Y'_2$ can also be mapped first. Then, the corresponding bit in sequence $W'_2$ that is output from the CTC encoder simultaneously with each bit in sequence $Y'_2$ is found. The parity bit that is output from the CTC encoder simultaneously with $Y'_{2,i}$ is denoted as $W'_{2,j}$. $W'_{2,j}$ is referred to as a group unit corresponding bit of $Y'_{2,i}$. Then, sequence $W'_2$ is mapped. If $Y'_{2,i}$ is mapped to a bit with high reliability, its group unit corresponding bit $W'_{2,j}$ should be mapped to a bit with low reliability. Also, if $Y'_{2,i}$ is mapped to a bit with low reliability, its group unit corresponding bit $W'_{2,j}$ should be mapped to a bit with high reliability. The parity bits in sequence $Y'_2$ and the bits in sequence $W'_2$, which are simultaneously output from the constituent encoder, constitute a bit group.

The above three exemplary schemes can be implemented independently, by combining any two of them together, or by combining all of them together. According to a result of a simulation, the least performance gain is obtained by only applying the second or third schemes. If both the second and third schemes are applied, the performance gain increases a little. When only the first scheme is applied, the performance is superior to that obtained by applying both the second and third schemes. If the first, second, and third schemes are applied, the best performance would generally be obtained.

Based on the Institute of Electrical and Electronics Engineers (IEEE) 802.16e implementation standard, subblock interleaving operations according to an exemplary embodiment of the present invention is described below with reference to FIG. 5.

Figure 5:
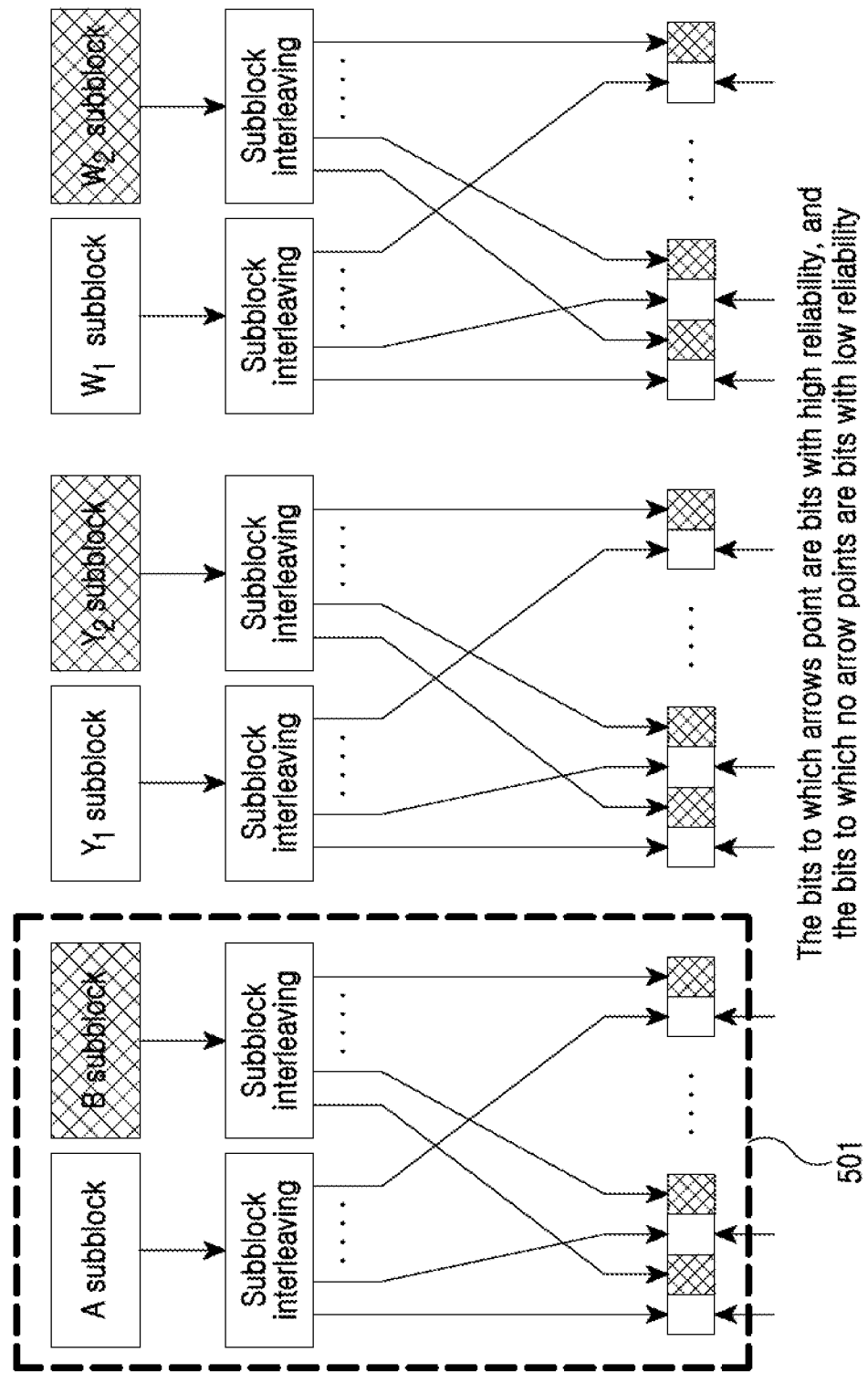
FIG. 5 illustrates remapping operations according to a first exemplary embodiment of the present invention.

FIG. 5 illustrates remapping operations according to a first exemplary embodiment of the present invention.

In FIG. 5, it is assumed that the outputs from a subblock interleaving module in an interleaver are sequences A', B', $Y'_1$, $Y'_2$, $W'_1$, $W'_2$. Here, A', B', $Y'_1$, $Y'_2$, $W'_1$, $W'_2$ are specifically arranged as $A'_0, A'_1, \ldots, A'_{N-1}; B'_0, B'_1, \ldots, B'_{N-1}; Y'_{1,0}, Y'_{1,1}, \ldots, Y'_{1,N-1}; Y'_{2,0}, Y'_{2,1}, \ldots, Y'_{2,N-1}; W'_{1,0}, W'_{1,1}, \ldots, W'_{1,N-1}; W'_{2,0}, W'_{2,1}, \ldots, W'_{2,N-1}$.

Referring to FIG. 5, as shown in block 501, sequence A' is mapped first. Based on the IEEE 802.16e standard, the corresponding bit in sequence B' that is input to the CTC encoder simultaneously with $A'_i$ is $B'_i$. Then, sequence B' is mapped. If $A'_i$ is mapped to a bit with high reliability, its group unit corresponding bit $B'_i$ should be mapped to a bit with low reliability. Also, if $A'_i$ is mapped to a bit with low reliability, its group unit corresponding bit $B'_i$ should be mapped to a bit with high reliability.

Of course, the above operations may also be performed to the bit group constituted of sequences $Y'_1$ and $W'_1$, and the bit group constituted of sequences $Y'_2$ and $W'_2$, respectively.

Figure 6:
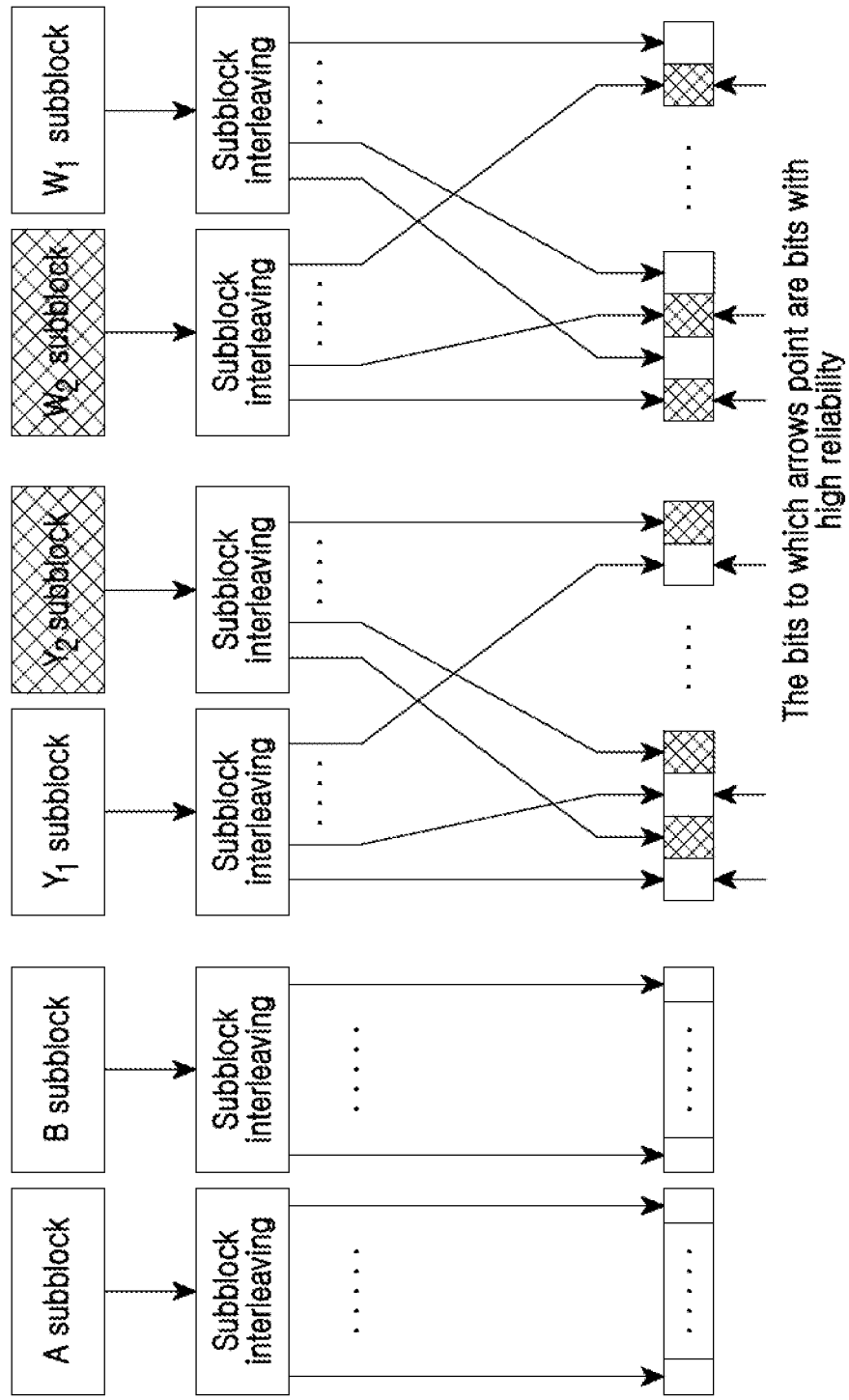
FIG. 6 illustrates remapping operations according to a second exemplary embodiment of the present invention.

FIG. 6 illustrates remapping operations according to a second exemplary embodiment of the present invention.

Referring to FIG. 6, sequence $Y'_1$ is mapped first. In the IEEE 802.16e standard, the parity bit that is output from the CTC encoder simultaneously with $Y'_{1,i}$ is $W'_{1,i}$. Then, sequence $W'_1$ is mapped. If $Y'_{1,i}$ is mapped to a bit with high reliability, its group unit corresponding bit $W'_{1,i}$ should be mapped to a bit with low reliability. Also, if $Y'_{1,i}$ is mapped to a bit with low reliability, its group unit corresponding bit $W'_{1,i}$ should be mapped to a bit with high reliability.

Then, sequence $Y'_2$ is mapped. Based on the IEEE 802.16e standard, the parity bit that is output from the CTC encoder simultaneously with $Y'_2$, is $W'_{2,i}$. Then, sequence $W'_2$ is mapped. If $Y'_{2,i}$ is mapped to a bit with high reliability, its group unit corresponding bit $W'_{2,i}$ should be mapped to a bit with low reliability. Also, if $Y'_{2,i}$ is mapped to a bit with low reliability, its group unit corresponding bit $W'_{2,i}$ should be mapped to a bit with high reliability.

Of course, the operation of alternate mapping may be performed first to the bits in the bit group constituted of sequences A' and B', and then to the bit group constituted of sequences $Y'_1$ and $W'_1$ or the bit group constituted of sequences $Y'_2$ and $W'_2$, respectively.

A third exemplary embodiment of the present invention that combines the first and second exemplary embodiments of the present invention is described below with reference to FIG. 7.

Figure 7:
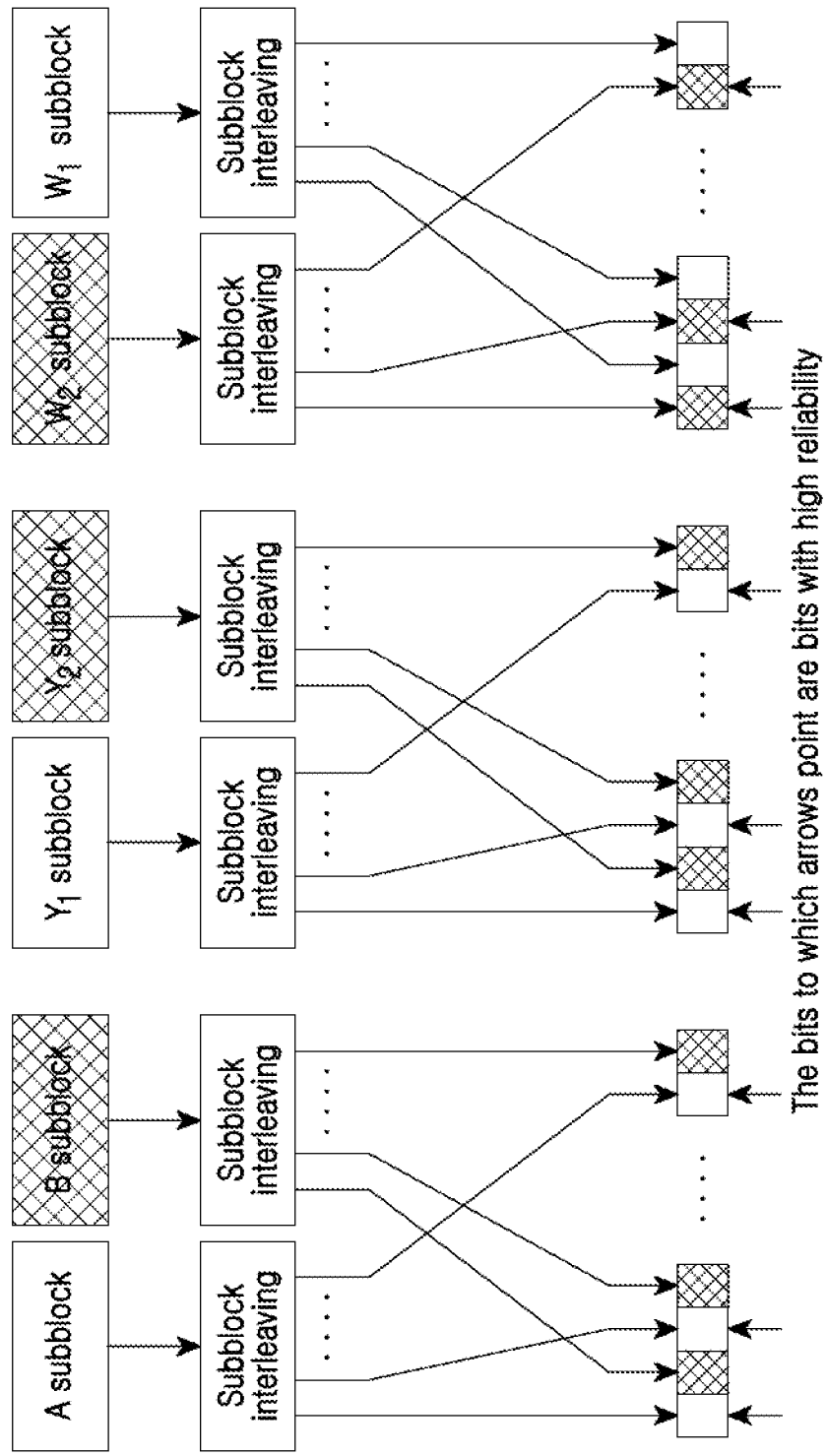
FIG. 7 illustrates remapping operations according to a third exemplary embodiment of the present invention.

FIG. 7 illustrates remapping operations according to a third exemplary embodiment of the present invention.

Referring to FIG. 7, sequence A' can be mapped first. The corresponding bit in sequence B' that is input to the CTC encoder simultaneously with $A'_i$ is $B'_i$. Then, sequence B' is mapped. If $A'_i$ is mapped to a bit with high reliability, its group unit corresponding bit $B'_i$ should be mapped to a bit with low reliability. Also, if the $A'_i$ is mapped to a bit with low reliability, its group unit corresponding bit $B'_i$ should be mapped to a bit with high reliability. Furthermore, as shown in FIG. 7, sequence $Y'_1$ is mapped. In the IEEE 802.16e standard, the parity bit that is output from the CTC encoder simultaneously with $Y'_{1,i}$ is $W'_{1,i}$. Then, sequence $W'_1$ is mapped. If $Y'_{1,i}$ is mapped to a bit with high reliability, its group unit corresponding bit $W'_{1,i}$ should be mapped to a bit with low reliability. Also, if the $Y'_{1,i}$ is mapped to a bit with low reliability, its group unit corresponding bit $W'_{1,i}$ should be mapped to a bit with high reliability. Then, sequence $Y'_2$ is mapped. In the IEEE 802.16e standard, the parity bit that is output from the CTC encoder simultaneously with $Y'_{2,i}$, $W'_{2,i}$. Then, sequence $W'_2$ is mapped. If $Y'_{2,i}$ is mapped to a bit with high reliability, its group unit corresponding bit $W'_{2,i}$ should be mapped to a bit with low reliability. Also, if the $Y'_{2,i}$ is mapped to a bit with low reliability, its group unit corresponding bit $W'_{2,i}$ should be mapped to a bit with high reliability.

In FIG. 7, the bits with high reliability are indicated by the bits to which arrows point. If the bits with high reliability are odd number bits and the bits with low reliability are even number bits as shown in FIG. 7, then the output sequences are $A'_0, A'_1, \ldots, A'_{N-1}; B'_1, B'_0, \ldots, B'_{N-1}, B'_{N-2}; Y'_{1,0}, Y'_{2,0}, Y'_{1,1}, Y'_{2,1}, \ldots, Y'_{1,N-1}, Y'_{2,N-1}; W'_{2,0}, W'_{1,0}, W'_{2,1}, W'_{1,1}, \ldots, W'_{2,N-1}, W'_{1,N-1}$.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A coding method comprising:
   a) interleaving information bits A and B using a Convolutional Turbo Coding (CTC) interleaver and outputting interleaved information bits C and D, respectively
   b) encoding the information bits A and B and the interleaved information bits C and D using a constituent encoder and outputting parity sequences $Y_1$, $W_1$, $Y_2$ and $W_2$, respectively;
   c) interleaving the information bits A and B, the parity sequences $Y_1$ and $Y_2$ and the parity sequences $W_2$ and $W_1$, respectively; and
   d) outputting:
      an interleaved information subblock A,
      an interleaved information subblock B,
      a bit-by-bit multiplexed sequence of interleaved $Y_1$ and $Y_2$ subblock sequences, wherein the bit-by-bit multiplexed sequence of the interleaved $Y_1$ and $Y_2$ subblock sequences comprises a first output bit from a $Y_1$ subblock interleaver, a first output bit from a $Y_2$ subblock interleaver, a second output bit from the $Y_1$ subblock interleaver, and a second output bit from the $Y_2$ subblock interleaver in order, and
      a bit-by-bit multiplexed sequence of interleaved $W_2$ and $W_1$ subblock sequences, wherein the bit-by-bit multiplexed sequence of the interleaved $W_2$ and $W_1$ subblock sequences comprises a first output bit from a $W_2$ subblock interleaver, a first output bit from a $W_1$ subblock interleaver, a second output bit from the $W_2$ subblock interleaver and a second output bit from the $W_1$ subblock interleaver in order.

2. The method according to claim 1,
   wherein, from among a group of two corresponding bits, a corresponding bit of the interleaved $W_2$ subblock sequence is mapped to a bit of constellation point with low reliability, if a corresponding bit of the interleaved $Y_2$ subblock sequence is mapped to a bit of constellation point with high reliability,
   wherein, from among a group of two corresponding bits, a corresponding bit of the interleaved $W_2$ subblock sequence is mapped to a bit of constellation point with high reliability, if a corresponding bit of the interleaved $Y_2$ subblock sequence is mapped to a bit of constellation point with low reliability,
   wherein, from among a group of two corresponding bits, a corresponding bit of the interleaved $W_1$ subblock sequence is mapped to a bit of constellation point with low reliability, if a corresponding bit of the interleaved $Y_1$ subblock is mapped to a bit of constellation point with high reliability, and
   wherein, from among a group of two corresponding bits, a corresponding bit of the interleaved $W_1$ subblock sequence is mapped to a bit of constellation point with high reliability, if a corresponding bit of the interleaved $Y_1$ subblock is mapped to a bit of constellation point with low reliability.

3. The method according to claim 1, wherein an interleaved information subblocks A and B are by-passed while parity sequences are multiplexed bit by bit.

4. An apparatus comprising:
   a Convolutional Turbo Coding (CTC) interleaver configured to interleave information bits A and B and to output interleaved information bits C and D, respectively;
   a constituent encoder configured to encode the information bits A and B and the interleaved information bits C and D and to output parity sequences $Y_1$, $W_1$, $Y_2$ and $W_2$, respectively; and
   a plurality of interleavers configured to interleave the information bits A and B, the parity sequences $Y_1$ and $Y_2$ and the parity sequences $W_2$ and $W_1$, respectively, and to output:
      an interleaved information subblock A,
      an interleaved information subblock B,
      a bit-by-bit multiplexed sequence of interleaved $Y_1$ and $Y_2$ subblock sequences, wherein the bit-by-bit multiplexed sequence of the interleaved $Y_1$ and $Y_2$ subblock sequences comprises a first output bit from a $Y_1$ subblock interleaver, a first output bit from a $Y_2$ subblock interleaver, a second output bit from the $Y_1$ subblock interleaver, and a second output bit from the $Y_2$ subblock interleaver in order, and
      a bit-by-bit multiplexed sequence of interleaved $W_2$ and $W_1$ subblock sequences, wherein the bit-by-bit multiplexed sequence of the interleaved $W_2$ and $W_1$ subblock sequences comprises a first output bit from a $W_2$ subblock interleaver, a first output bit from a $W_1$ subblock interleaver, a second output bit from the $W_2$ subblock interleaver and a second output bit from the $W_1$ subblock interleaver in order.

5. The apparatus according to claim 4,
   wherein, from among a group of two corresponding bits, a corresponding bit of the interleaved $W_2$ subblock sequence is mapped to a bit of constellation point with low reliability, if a corresponding bit of the interleaved $Y_2$ subblock sequence is mapped to a bit of constellation point with high reliability,
   wherein, from among a group of two corresponding bits, a corresponding bit of the interleaved $W_2$ subblock sequence is mapped to a bit of constellation point with high reliability, if a corresponding bit of the interleaved $Y_2$ subblock sequence is mapped to a bit of constellation point with low reliability,
   wherein, from among a group of two corresponding bits, a corresponding bit of the interleaved $W_1$ subblock sequence is mapped to a bit of constellation point with low reliability, if a corresponding bit of the interleaved $Y_1$ subblock is mapped to a bit of constellation point with high reliability, and
   wherein, from among a group of two corresponding bits, a corresponding bit of the interleaved $W_1$ subblock sequence is mapped to a bit of constellation point with high reliability, if a corresponding bit of the interleaved $Y_1$ subblock is mapped to a bit of constellation point with low reliability.

6. The apparatus according to claim 4, wherein an interleaved information subblocks A and B are by-passed while parity sequences are multiplexed bit by bit.

7. An apparatus comprising:
a plurality of subblock interleavers configured to receive an information subblock A, an information subblock B, a parity sequence of a $Y_1$ subblock, a parity sequence of a $Y_2$ subblock, a parity sequence of a $W_2$ subblock and a parity sequence of a $W_1$ subblock, and to output:
an interleaved information subblock A,
an interleaved information subblock B,
a bit-by-bit multiplexed sequence of interleaved $Y_1$ and $Y_2$ subblock sequences, wherein the bit-by-bit multiplexed sequence of the interleaved $Y_1$ and $Y_2$ subblock sequences comprises a first output bit from a $Y_1$ subblock interleaver, a first output bit from a $Y_2$ subblock interleaver, a second output bit from the $Y_1$ subblock interleaver, and a second output bit from the $Y_2$ subblock interleaver in order, and
a bit-by-bit multiplexed sequence of interleaved $W_2$ and $W_1$ subblock sequences, wherein the bit-by-bit multiplexed sequence of the interleaved $W_2$ and $W_1$ subblock sequences comprises a first output bit from a $W_2$ subblock interleaver, a first output bit from a $W_1$ subblock interleaver, a second output bit from the $W_2$ subblock interleaver, and a second output bit from the $W_1$ subblock interleaver in order.

8. The apparatus according to claim 7,
wherein, from among a group of two corresponding bits, a corresponding bit of the interleaved $W_2$ subblock sequence is mapped to a bit of constellation point with low reliability, if a corresponding bit of the interleaved $Y_2$ subblock sequence is mapped to a bit of constellation point with high reliability,
wherein, from among a group of two corresponding bits, a corresponding bit of the interleaved $W_2$ subblock sequence is mapped to a bit of constellation point with high reliability, if a corresponding bit of the interleaved $Y_2$ subblock sequence is mapped to a bit of constellation point with low reliability,
wherein, from among a group of two corresponding bits, a corresponding bit of the interleaved $W_1$ subblock sequence is mapped to a bit of constellation point with low reliability, if a corresponding bit of the interleaved $Y_1$ subblock is mapped to a bit of constellation point with high reliability, and
wherein, from among a group of two corresponding bits, a corresponding bit of the interleaved $W_1$ subblock sequence is mapped to a bit of constellation point with high reliability, if a corresponding bit of the interleaved $Y_1$ subblock is mapped to a bit of constellation point with low reliability.

9. The apparatus according to claim 7, wherein the interleaved information subblocks A and B are by-passed while parity sequences are multiplexed bit by bit.

10. A method comprising:
receiving, by a plurality of subblock interleavers, an information subblock A, an information subblock B, a parity sequence of $Y_1$ subblock, a parity sequence of $Y_2$ subblock, a parity sequence of $W_2$ subblock and a parity sequence of $W_1$ subblock; and
outputting, by the plurality of subblock interleavers:
an interleaved information subblock A,
an interleaved information subblock B,
a bit-by-bit multiplexed sequence of interleaved $Y_1$ and $Y_2$ subblock sequences, wherein the bit-by-bit multiplexed sequence of the interleaved $Y_1$ and $Y_2$ subblock sequences comprises a first output bit from a $Y_1$ subblock interleaver, a first output bit from a $Y_2$ subblock interleaver, a second output bit from the $Y_1$ subblock interleaver, and a second output bit from the $Y_2$ subblock interleaver in order, and
a bit-by-bit multiplexed sequence of interleaved $W_2$ and $W_1$ subblock sequences, wherein the bit-by-bit multiplexed sequence of the interleaved $W_2$ and $W_1$ subblock sequences comprises a first output bit from a $W_2$ subblock interleaver, a first output bit from a $W_1$ subblock interleaver, a second output bit from the $W_2$ subblock interleaver and a second output bit from the $W_1$ subblock interleaver in order.

11. The method according to claim 10,
wherein, from among a group of two corresponding bits, a corresponding bit of the interleaved $W_2$ subblock sequence is mapped to a bit of constellation point with low reliability, if a corresponding bit of the interleaved $Y_2$ subblock sequence is mapped to a bit of constellation point with high reliability,
wherein, from among a group of two corresponding bits, a corresponding bit of the interleaved $W_2$ subblock sequence is mapped to a bit of constellation point with high reliability, if a corresponding bit of the interleaved $Y_2$ subblock sequence is mapped to a bit of constellation point with low reliability,
wherein, from among a group of two corresponding bits, a corresponding bit of the interleaved $W_1$ subblock sequence is mapped to a bit of constellation point with low reliability, if a corresponding bit of the interleaved $Y_1$ subblock is mapped to a bit of constellation point with high reliability, and
wherein, from among a group of two corresponding bits, a corresponding bit of the interleaved $W_1$ subblock sequence is mapped to a bit of constellation point with high reliability, if a corresponding bit of the interleaved $Y_1$ subblock is mapped to a bit of constellation point with low reliability.

12. The method according to claim 10, wherein the interleaved information subblocks A and B are by-passed while parity sequences are multiplexed bit by bit.

\* \* \* \* \*